US008902946B2

(12) United States Patent
Chua et al.

(10) Patent No.: US 8,902,946 B2
(45) Date of Patent: Dec. 2, 2014

(54) PHOTONIC CRYSTAL SURFACE-EMITTING LASERS ENABLED BY AN ACCIDENTAL DIRAC POINT

(71) Applicants: Song Liang Chua, Singapore (SG); Ling Lu, Cambridge, MA (US); Marin Soljacic, Belmont, MA (US)

(72) Inventors: Song Liang Chua, Singapore (SG); Ling Lu, Cambridge, MA (US); Marin Soljacic, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 8 days.

(21) Appl. No.: 13/771,935

(22) Filed: Feb. 20, 2013

(65) Prior Publication Data

US 2014/0064310 A1  Mar. 6, 2014

Related U.S. Application Data

(60) Provisional application No. 61/660,968, filed on Jun. 18, 2012.

(51) Int. Cl.
*H01S 5/10* (2006.01)
*H01S 5/187* (2006.01)
*H01S 5/18* (2006.01)

(52) U.S. Cl.
CPC ............... *H01S 5/105* (2013.01); *H01S 5/187* (2013.01); *H01S 5/18* (2013.01)
USPC .................................. 372/45.01; 372/50.11

(58) Field of Classification Search
CPC ......... H01S 5/1039; H01S 5/105; H01S 5/12; H01S 5/125; H01S 5/18; H01S 5/187
USPC ............................. 372/45.01, 50.11
See application file for complete search history.

(56) References Cited

U.S. PATENT DOCUMENTS 7,684,460 B2 *  3/2010  Hori ................................ 372/99

OTHER PUBLICATIONS

C. T. Chan et al., "Dirac cone and double zero materials," AIP Conf. Proc. 1398, 21 (2011); doi 10.1063/1.3644199.
Charles J Choi et al., "Surface-enhanced Raman nanodomes," Nanotechnology 21 415301 (Sep. 13, 2010) doi:10.1088/0957-4484/21/41/415301.
H. Altug et al., "Experimental demonstration of the slow group velocity of light in two-dimensional coupled photonic crystal microcavity arrays," Applied Letters Physics, vol. 86, pp. 111102-1-111102-3 (2005).

(Continued)

*Primary Examiner* — Julio J Maldonado
*Assistant Examiner* — Michael Carter
(74) *Attorney, Agent, or Firm* — Cooley LLP (57) ABSTRACT

A photonic-crystal surface-emitting laser (PCSEL) includes a gain medium electromagnetically coupled to a photonic crystal whose energy band structure exhibits a Dirac cone of linear dispersion at the center of the photonic crystal's Brillouin zone. This Dirac cone's vertex is called a Dirac point; because it is at the Brillouin zone center, it is called an accidental Dirac point. Tuning the photonic crystal's band structure (e.g., by changing the photonic crystal's dimensions or refractive index) to exhibit an accidental Dirac point increases the photonic crystal's mode spacing by orders of magnitudes and reduces or eliminates the photonic crystal's distributed in-plane feedback. Thus, the photonic crystal can act as a resonator that supports single-mode output from the PCSEL over a larger area than is possible with conventional PCSELs, which have quadratic band edge dispersion. Because output power generally scales with output area, this increase in output area results in higher possible output powers.

35 Claims, 9 Drawing Sheets

(56) References Cited

OTHER PUBLICATIONS

J. Bravo-Abad, J. D. Joannopoulos, and M. Soljacic, "Enabling single-mode behavior over large areas with photonic Dirac cones," Proceedings of the National Academy of Sciences of the United States of America, vol. 109, Issue 25, pp. 9761-9765, DOI: 10.1073/pnas.1207335109 (Jun. 19, 2012).

J. Bravo-Abad, J. D. Joannopoulos, M. Soljacic, "Enabling single-mode behavior over large areas with photonic Dirac cones," arXiv:1204.0500 [cond-mat.mes-hall] (Submitted on Apr. 2, 2012).

J. Lee et al., "Observation and Differentiation of Unique High-Q Optical Resonances Near Zero Wave Vector in Macroscopic Photonic Crystal Slabs," Phys. Rev. Lett. 109, 067401 (2012) [5 pages].

K. Sakoda, "Dirac cone in two- and three-dimensional metamaterials," Optics Express, vol. 20, No. 4, pp. 3898-3917 (Feb. 13, 2012; published on-line Feb. 1, 2012).

K. Sakoda, "Double Dirac cones in triangular-lattice metamaterials," Optics Express, vol. 20, No. 9, pp. 9925-9939 (Apr. 23, 2012).

K. Sakoda, "Universality of mode symmetries in creating photonic Dirac cones," J. Opt. Soc. Am. B., vol. 29, No. 10, pp. 2770-2778 (Oct. 2012).

Kent D. Choquette, Dominic F. Siriani, Ansas M. Kasten, et al., "Single Mode Photonic Crystal Vertical Cavity Surface Emitting Lasers," Advances in Optical Technologies, vol. 2012, Article ID 280920, 8 pages, 2012. doi:10.1155/2012/280920.

M. Ibanescu et al., "Ultra-flat bands in two-dimensional photonic crystals," Proc. of SPIE, vol. 6128, 6 pp. (2006).

M. Imada et al., "Coherent two-dimensional lasing action in surface-emitting laser with triangular-lattice photonic crystal structure," Appl. Phys. Lett. 75, 316 (1999); doi: 10.1063/1.124361.

M. Imada, A. Chutinan, S. Noda, and M. Mochizuki, "Multidirectionally distributed feedback photonic crystal lasers," Phys. Rev. B, vol. 65, p. 195306, 2002.

M. Soljacic et al., "Enhancement of nonlinear effects using photonic crystals," Nature Materials, vol. 3, pp. 211-219 (Apr. 2004).

M. Soljacic et al., "Photonic-crystal slow-light enhancement of nonlinear phase sensitivity," J. Opt. Soc. Am. B., vol. 19, No. 9, pp. 2052-2059 (Sep. 2002).

Ofer Shapira, "Nanophotonic structures for enhanced light-matter interaction," presentation at George Washington University on Feb. 16, 2012.

R. A. Sepkhanov, Ya. B. Bazaliy, and C. W. J. Beenakker, "Extremal transmission at the Dirac point of a photonic band structure," Phys. Rev. A 75, 063813 (2007).

S. Fan and J. D. Joannopoulos, "Analysis of guided resonances in photonic crystal slabs," Phys. Rev. B, 65, 235112 (2002).

S. Longhi et al., "X-shaped waves in photonic crystals," Physical Review, vol. 70, pp. 235123-1-235123-7 (2004).

S.-L. Chua et al., "Larger-area single-mode photonic crystal surface-emitting lasers enabled by the accidental Dirac-point," in 2012 IEEE Photonic Conference Proceedings, pp. 346-347, Sep. 23-27, 2012.

W. Kunishi et al., "High-power single-lobed surface-emitting photonic-crystal laser," CLEO/QELS 2006 Conf. Proceedings, pp. 1-2, May 21-26, 2006, doi: 10.1109/CLE0.2006.4627795.

X. Huang et al., "Dirac cones induced by accidental degeneracy in photonic crystals and zero-refractive-index materials," Nature Materials, vol. 10, pp. 582-586 (Aug. 2011).

Hirose, K. et al., "Watt-class high-power, high-beam-quality photonic-crystals lasers", Nature Photonics 8.5 (2014): 406-411.

Imada, M. et al., "Semiconductor Lasers with One- and Two-Dimensional Ar/Semiconductor Gratings Embedded by Wafer Fusion Technique", IEEE Journal of Selected Topics in Quantum Electronics, vol. 5, No. 3, May/Jun. 1999, pp. 658-663.

Matsubara, H., et al. "GaN photonic-crystal surface-emitting laser at blue-violet wavelengths." Science 319.5862 (2008): 445-447.

\* cited by examiner

PHOTONIC CRYSTAL SURFACE-EMITTING LASERS ENABLED BY AN ACCIDENTAL DIRAC POINT

CROSS-REFERENCE TO RELATED PATENT APPLICATIONS

This application claims the benefit, under 35 U.S.C. §119 (e), of U.S. Provisional Application No. 61/660,968, filed Jun. 18, 2012, which application is hereby incorporated herein by reference in its entirety.

GOVERNMENT SUPPORT

This invention was made with Government support under Grant No. W911NF-07-D-0004 awarded by the Army Research Office, under Grant No. DMR-0819762 awarded by the National Science Foundation, and under Grant Nos. DE-SC0001299 and DE-FG02-09ER46577 awarded by the Department of Energy. The Government has certain rights in this invention.

BACKGROUND

Telecommunications, spectroscopy, laser printing, biological tissue analysis, and metrology are just some of the applications that benefit from high-power, single-mode on-chip lasers with good beam qualities. Distributed feedback (DFB) lasers and vertical-cavity surface-emitting lasers (VCSELs) rely on one-dimensional feedback structures to provide relatively high-power, single-mode beams. Unfortunately, these lasers suffer from intrinsic drawbacks: DFB lasers and other edge-emitting sources tend to suffer from catastrophic optical damage at their facets, and the VCSELs' output powers are usually limited by their small cavity sizes.

Two-dimensional distributed feedback enables broad-area, single-mode operation from surface emitters, including photonic-crystal surface-emitting lasers (PCSELs). PCSELs are essentially two-dimensional versions of second-order DFB lasers, where the higher quality factor lasing mode is selected through symmetry mismatch to the free-space modes. In particular, PCSELs have achieved high surface-emitting single-mode power and the ability to control the shapes, polarizations, and directions of their far-fields. However, the lasing areas of PCSELs are limited by two fundamental constraints. First, the mode spacing decreases as the cavity area increases, which promotes multi-mode lasing. Second, the distributed in-plane feedback localizes the lasing fields to individual sections, which promotes multi-area lasing. Since the output power scales with the lasing area, these constraints limit the maximum output power of a single-mode beam emitted by a PCSEL.

SUMMARY

Embodiments of the present invention include a surface-emitting laser and methods of making and using surface-emitting lasers. In one example, the surface-emitting laser comprises a gain medium and a photonic crystal, which is electromagnetically coupled to the gain medium and has an energy band structure characterized by a Dirac point at or near a center of a Brillouin zone of the photonic crystal and at a frequency within the gain medium's gain band. The gain medium emits an electromagnetic wave that is coupled into the photonic crystal, which supports radiation of at least a portion of the energy in the electromagnetic wave in a direction substantially orthogonal to a plane of the photonic crystal.

In certain embodiments, the gain medium comprises a quantum well, a quantum dot, a quantum wire, or an organic molecule. For instance, the gain medium may comprise semiconductor material, such as GaAs, AlGaAs, InGaAs, InGaAsP, GaN, Si, Ge, GaP, InAlGaN, InAs, InSb or SiN. The photonic crystal may also comprise a semiconductor, such as GaAs, AlGaAs, InGaAs, InGaAsP, GaN, Si, Ge, GaP, InAlGaN, InAs, InSb, or SiN.

The photonic crystal supports propagation of a single mode of the electromagnetic wave in the plane of the photonic crystal. This single mode may be the first mode from the center of the photonic crystal's Brillouin zone. In some cases, the photonic crystal defines a two-dimensional surface with an area $L^2$, through which the energy radiates out of the photonic crystal, and the spacing between the first mode and a second mode from the center of the Brillouin zone varies in proportion to $L^{-1}$.

In some embodiments, the photonic crystal's Dirac point comprises an intersection of respective linear regions of at least two energy bands in the energy band structure of the photonic crystal. In a subset of these embodiments, the Dirac point may represent an intersection of respective linear regions of at least three energy bands in the energy band structure of the photonic crystal.

The Dirac point may be determined by selecting the photonic crystal's structure, which can be characterized by a period a of about 150 nm to about 550 nm. The surface-emitting laser's output surface may have at least one dimension (e.g., an edge or inradius) of about 10a to about 10,000a. The photonic crystal's thickness may be about $\lambda/10$ to about 10a, where $\lambda$ is the wavelength of the electromagnetic wave.

For instance, the photonic crystal may define a plurality of holes having a radius r, a period a, and a first index $n_1$ in a dielectric material having a second index $n_2$, such that the ratio r/a ratio is about 0 to about 0.5 and the ratio $n_1/n_2$ is about 0.25 to about 1.0. The photonic crystal may also comprises a plurality of rods having a radius r, a period a, and a first index $n_1$ in a dielectric material having a second index $n_2$. In these embodiments, the ratio r/a is about 0 to about 0.5 and the ratio $n_1/n_2$ is about 1.0 to about 4.0. In either case, these holes and/or rods may be arrayed in an oblique lattice, a rectangular lattice, a rhombic lattice, a hexagonal lattice, or a square lattice.

Some embodiments of the surface-emitting laser may also include at least one electrode, in electrical communication with the gain medium, to stimulate emission of the electromagnetic wave from the gain medium. They may also include a pump source, such as another laser, in optical communication with the gain medium, to optically pump the gain medium so as to stimulate emission of the electromagnetic wave from the gain medium.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 5A is diagram of a finite-sized photonic crystal cavity that includes a triangular array of dielectric rods ($\epsilon_{rod}$=12:5) embedded in air with a period a and a dimension L=40a.

FIG. 5B is a plot of high out-of-plane quality factor band dispersions near Γ of three photonic crystals with different rod radii; the upper band has a linear dispersion and the lower bands have quadratic dispersions.

DETAILED DESCRIPTION

Figure 1A:
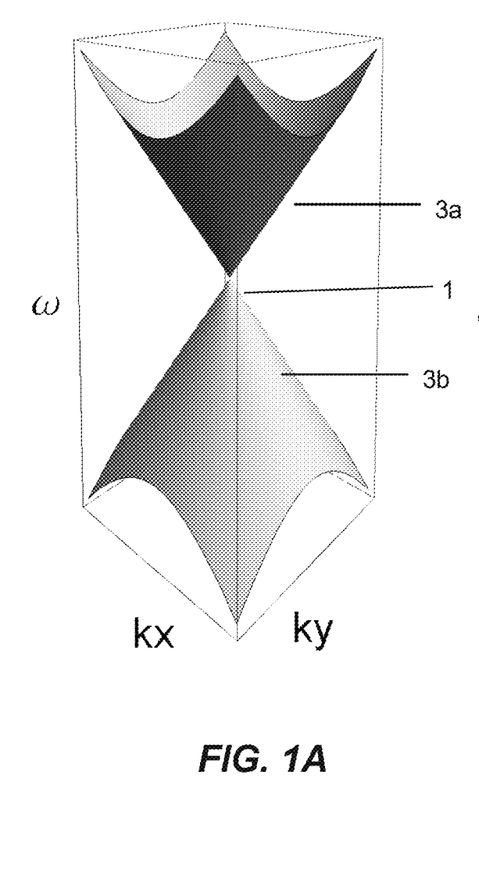
FIG. 1A is a three-dimensional plot of an energy band structure for a two-dimensional photonic crystal characterized by a Dirac cone.

Dirac points and Dirac cones represent special (linear) dispersion relations in the band structure of photonic crystals that are periodic in at least one dimension and at least two dimensions, respectively. FIG. 1A illustrates the band structure of a two-dimensional photonic crystal whose band structure include a pair of Dirac cones 3a and 3b whose vertex defines a Dirac point 1. The Dirac cones 3a and 3b are formed by two energy bands with linear dispersion, which can be characterized as a linear change in energy E with spatial frequency $k_{x,y}$. In this case, the band gap between the linear regions of these energy bands shrinks to nothing, causing the energy bands to touch each other. This intersection point (the conical singularity) is called a Dirac point. When viewed from one direction (e.g., the x or y direction), the Dirac point appears at the intersection between the linear portions of the energy bands. The photonic crystal's density of states (DOS) vanishes at the Dirac point.

Figure 1B:
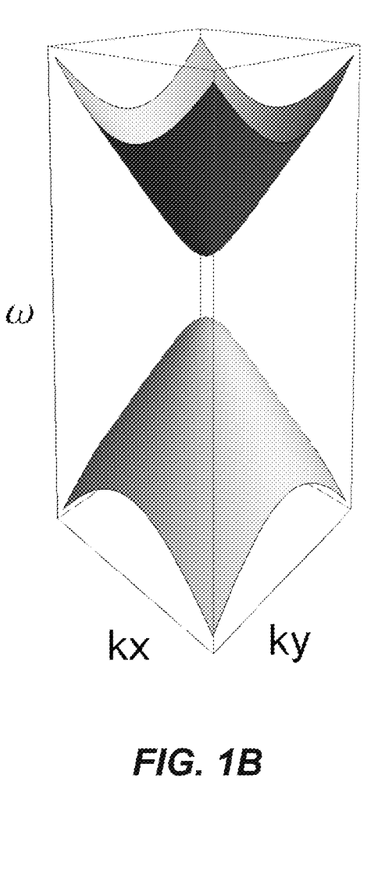
FIG. 1B is a three-dimensional plot of an energy band structure for a two-dimensional photonic crystal characterized by dispersion relations approaching a Dirac point.
Figure 1C:
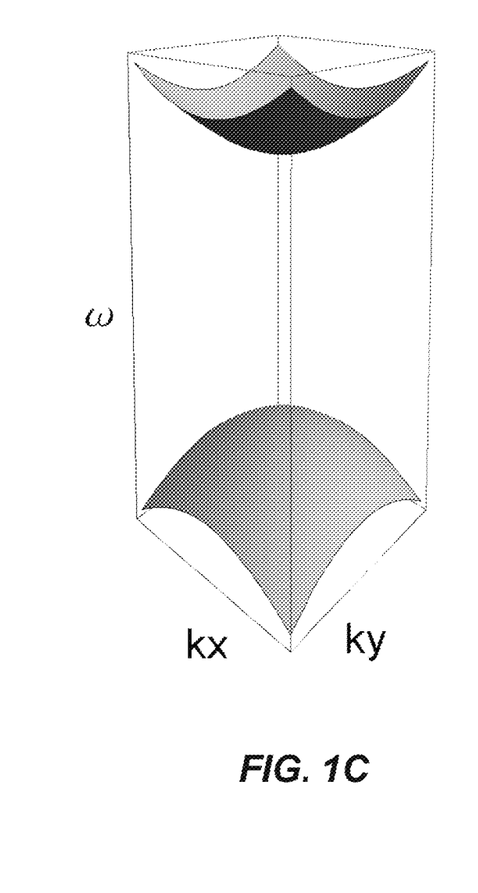
FIG. 1C is a three-dimensional plot of an energy band structure for a two-dimensional photonic crystal characterized by a pair of energy bands with quadratic dispersion.

FIG. 1B illustrates the band structure of a two-dimensional photonic crystal whose band structure is characterized by dispersion relations approaching a Dirac point. This photonic crystal exhibits properties similar to those of a photonic crystal whose band structure includes a Dirac point. In contrast, FIG. 1C is a three-dimensional plot of the band structure of a photonic crystal whose energy bands exhibit quadratic dispersion and do not touch. The density of states for this photonic crystal does not vanish over the region illustrated in FIG. 1B.

Although it is well-known that pairs of Dirac cone pairs can exist in photonic crystals, it is less common to find a single Dirac cone pair at the center of a photonic crystal's Brillouin zone. (As understood by those of ordinary skill in the art, the Γ point, or simply Γ, marks the center of the Brillouin zone, which can be thought of as the unit cell of the photonic crystal's reciprocal lattice.) This single Dirac cone pair can form when the photonic crystal is geometrically tuned so that a singly-degenerate band is accidentally degenerate with a pair of doubly-degenerate bands at Γ. When this happens, two of the photonic crystal's three energy bands form an isotropic Dirac cone pair. The photonic crystal's other energy band is flat. Because the degeneracy is considered "accidental," a Dirac point at the center of the Brillouin zone (i.e., at Γ) is called an "accidental" Dirac point.

A photonic crystal can be engineered to include an accidental Dirac point. Many different combinations of lattice shape (e.g., oblique, rectangular, rhombic (centered rectangular), hexagonal, or square), array type (e.g., dielectric rods in air or air holes in a dielectric slab), and index contrast (e.g., high or low) yield photonic crystals with accidental Dirac points. As will be appreciated by those of ordinary skill in the art, a particular combination can be chosen to suit a particular application or device.

Photonic-Crystal Surface-Emitting Laser Enabled by an Accidental Dirac Point

As explained in greater detail below, incorporating a photonic crystal whose band structure exhibits an accidental Dirac point into a photonic crystal, surface-emitting laser (PCSEL) enables both single-mode lasing and vertical emission. Radiation emitted by the PCSEL's gain medium resonates in a cavity defined by the photonic crystal. Because the photonic crystal's band structure exhibits an accidental Dirac point, the cavity's modes are widely spaced. In addition, one of these widely spaced modes has an out-of-plane quality factor that diverges below a critical wave vector (e.g., |k|<0.01, 0.001, or 0.0001), whereas the out-of-plane quality factors for the cavity's other modes do not diverge. As a result, energy in the mode associated with the divergent out-of-plane quality factor radiates vertically from the cavity. This radiated energy forms a beam with a single longitudinal mode and, if the cavity is designed appropriately, a single transverse mode. (Strictly speaking, the out-of-plane quality factor of a finite-sized photonic crystal does not diverge. In the case of a finite-sized photonic crystal, the mode nearest to Γ has a higher out-of-plane quality factor than the other neighboring modes, so it may be selected for single-mode lasing.)

Figure 2A:
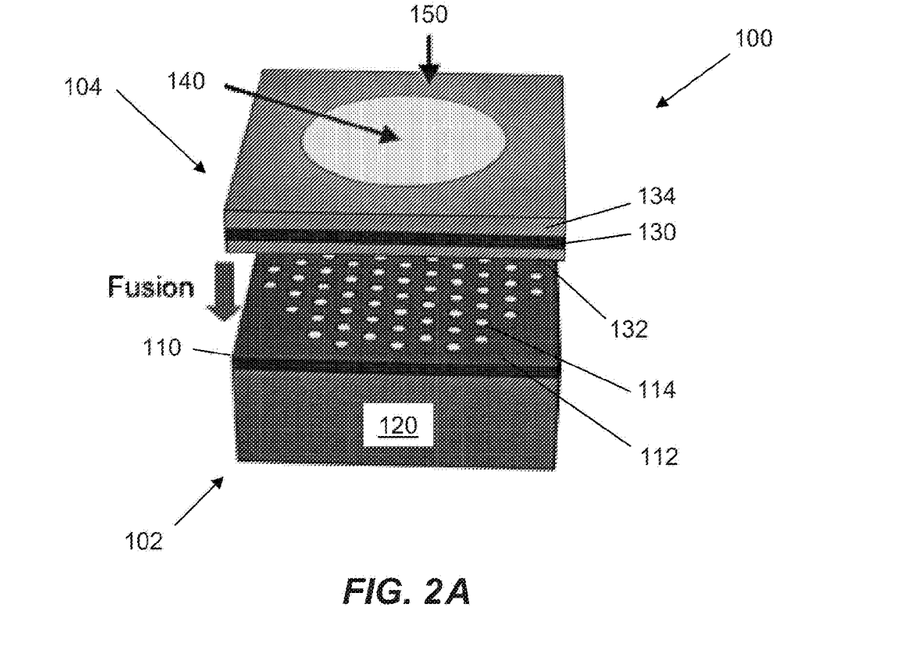
FIG. 2A is a diagram of a surface-emitting laser that includes a photonic crystal whose band structure exhibits a Dirac point at or near the center of the Brillouin zone.

FIG. 2A shows a PCSEL 100 that includes a photonic crystal 110 whose energy band structure is characterized by an accidental Dirac point (i.e., a Dirac point at Γ). The photonic crystal 110 depicted in FIG. 2A includes a slab 112 of dielectric material, such as GaAs, AlGaAs, InGaAs, InGaAsP, GaN, Si, Ge, GaP, InAlGaN, InAs, InSb and SiN or any other suitable material. The dielectric slab 112 has a thickness of about $\lambda/2n$ to about $m\lambda/n$ (e.g., about $\lambda/10n$ to about $10\lambda/n$), where $\lambda$ is the wavelength of the light emitted by the PCSEL 100, m is a positive integer, and n is the dielectric slab's refractive index, which may range from about 1.5 to about 4.0 depending on the material. Suitable emission wavelengths include wavelengths in the visible spectrum (about 400 nm to about 700 nm) and wavelengths in the infrared spectrum (e.g., about 700 nm to about 1600 nm). In some embodiments, the PCSEL 100 may be tuned between or among different wavelengths, e.g., by heating or cooling to change the cavity's effective optical length.

The dielectric slab 112 is patterned with air holes 114 whose radius r of the air holes, lattice shape, and lattice period a are chosen to ensure that the photonic crystal's band structure includes the accidental Dirac point. (Alternatively, the photonic crystal's band structure may be characterized by dispersion relations approaching a Dirac point as shown in FIG. 1B.) Typically, to operate in the visible or near-infrared portions of the electromagnetic spectrum, the lattice period a is chosen to be between about 150 nm and about 550 nm. The hole radius r is about 0 to about 0.5a. For a given system, there may exist more than one hole radius where the accidental Dirac point exists, but some points may better suit the lasing applications than others. Similarly, if all of the system's parameters are fixed (hole radius, material choices, refractive indices/index contrast, slab thickness, etc.), then achieving an accidental Dirac point may be possible with only a specific lattice parameter.

The dielectric slab 112 (or, more precisely, the dielectric slab's refractive index) is chosen to provide a desired index contrast, which is the ratio of the dielectric material's refractive index (e.g., n≈3) to the holes' refractive index (about 1.0 for air holes). If desired, the holes can be filled with other material to change the photonic crystal's index contrast. The index contrast can be reversed, e.g., by fabricating the photonic crystal from high-index rods 113 in a low-index medium 111, such as air, instead of low-index holes in a high-index medium as in the PCSEL 101 of FIG. 2B. The lattice shape and period a can be varied as well. In this case, the lattice is triangular; in other cases, it may be square or rectangular.

The photonic crystal 110 is on top of a substrate 120 whose refractive index is lower than that of the photonic crystal 110. Together, the photonic crystal 110 and the substrate 120 form a first wafer 102 that is fused or otherwise bonded to a second wafer 104 to form the PCSEL 100. The two wafers 102 and 104 may be bonded together using fusion bonding, flip-chip bonding, or any other suitable bonding process.

The second wafer 104 includes a gain medium 130 sandwiched between a lower cladding layer 132 and an upper cladding layer 134. Bonding the first wafer 102 to the second wafer 104 electromagnetically couples the photonic crystal 110 to the gain medium 130, which may include one or more quantum wells (e.g., a multi-quantum well structure), one or more quantum dots, and/or one or more quantum wires. Similarly, the photonic crystal 110 may include at least one quantum well.

The gain medium 130 can also be disposed in or directly on the photonic crystal 110 so long as it is electromagnetically coupled to the photonic crystal 100. For instance, the gain medium 130 may comprise quantum dots dispersed in a layer coated on or with evanescent coupling distance of the photonic crystal 110.

Alternatively, or in addition, the gain medium 130 may include organic material disposed on or within the photonic crystal 110. For instance, the gain medium 130 may include a liquid or solid organic dye medium, including but not limited to such as rhodamine, fluorescein, coumarin, stilbene, umbelliferone, tetracene, malachite green, or poly(methyl methacrylate). In liquid form, the organic dye medium may flow over the photonic crystal 110 or be held in a separate cavity that is electromagnetically coupled to the photonic crystal 110. In solid form, the organic dye medium may deposited on (e.g., by spin-coating) directly on the photonic crystal 110 or on another layer in the PCSEL 100.

Figure 2B:
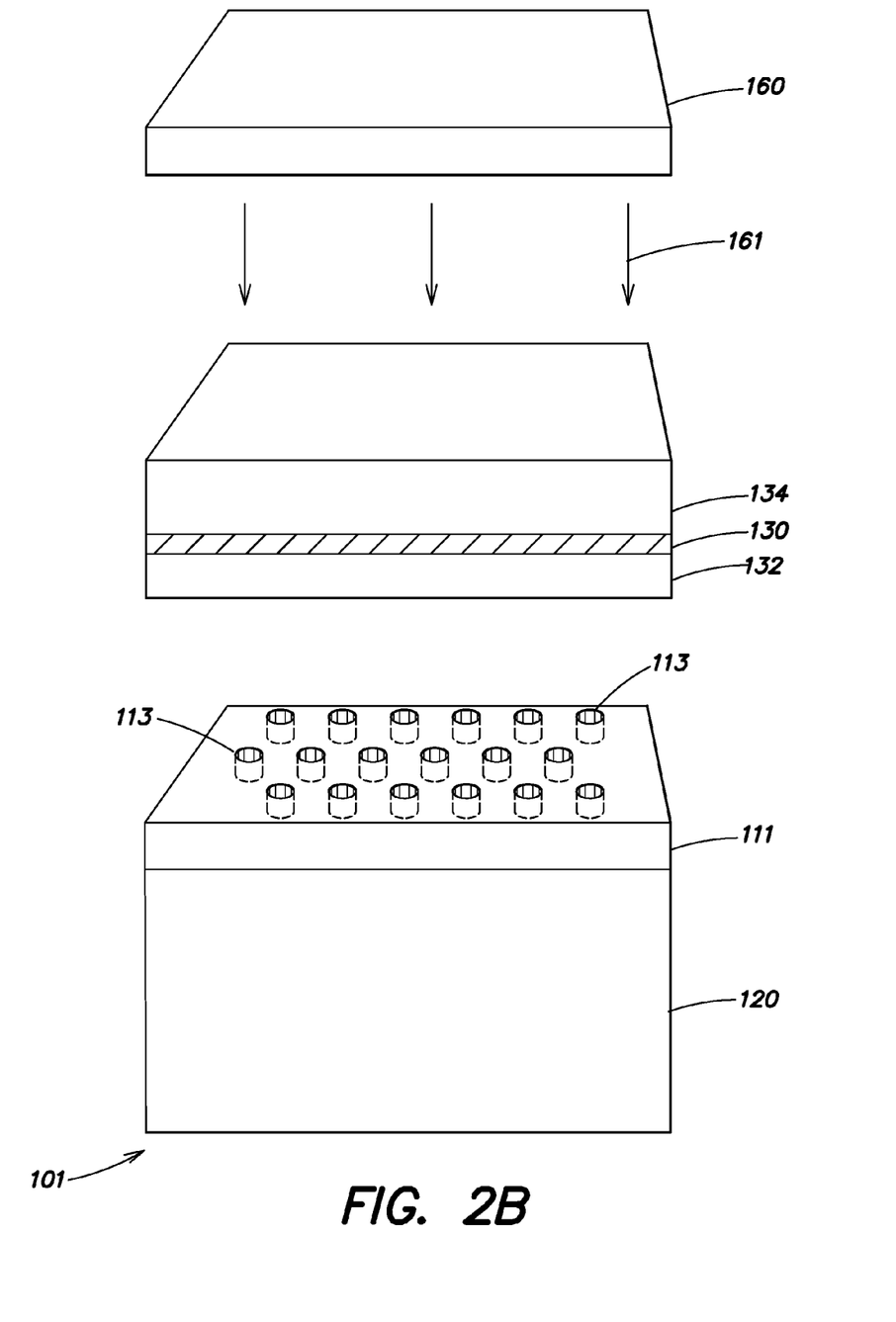
FIG. 2B is a diagram of an optically pumped, surface-emitting laser that includes a photonic crystal comprising rods whose band structure exhibits a Dirac point at or near the center of the Brillouin zone.

The PCSEL 100 also includes an electrode 140 on the outer surface of the upper cladding layer 134 for electrically pumping the gain medium 130. (The gain medium 130 can also be pumped optically instead of electrically using a pump source 160, such as a laser diode, a lamp, or a light-emitting diode, that illuminates the gain medium 130 with a pump beam 161 as shown in FIG. 2B.) As understood by those of ordinary skill in the art, pumping the gain medium 130 causes the gain medium 130 to emit an electromagnetic wave, which is coupled into the photonic crystal 110. The electromagnetic wave propagates within a plane defined by the photonic crystal 110 as indicated by solid arrows 11 in FIG. 3. The arrows' directions are determined by the lattice pattern, which in this case is triangular.

Figure 3:
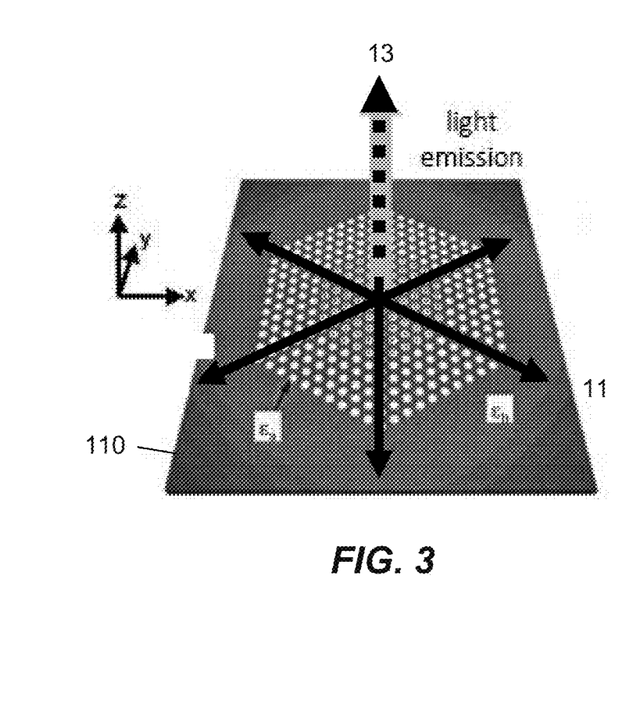
FIG. 3 is a diagram of the photonic crystal in the laser of FIG. 2A showing directions in which the electromagnetic wave propagates (within the plane of the photonic crystal; solid lines) and in which energy radiates (out of the plane of the photonic crystal; dashed line).

Facets or reflective coatings on the dielectric slab's edges reflect at least a portion of the wave, causing the wave to resonate within the plane of the photonic crystal 110. In addition, in-plane feedback (interactions among forward and backward waves, e.g., as in a typical Fabry-Perot cavity) exists even without the existence of the slab's edge. In other words, standing waves are formed within each unit-cell of the photonic crystal, independent of and in addition to the reflection from the slab's edge. Power from the electromagnetic wave radiates in a direction 13 (dotted line) orthogonal to the plane of the photonic crystal 110. The PCSEL 100 emits this radiated power as a single-mode beam via an output surface 150 defined by the upper cladding layer 134.

Achieving an Accidental Dirac Point with a Hexagonal Lattice of Dielectric Rods

Figure 4A:
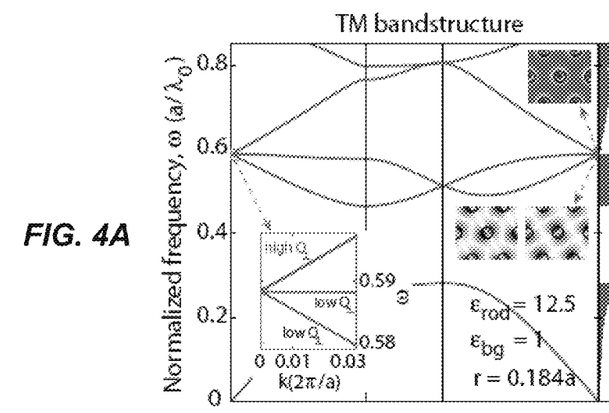
FIG. 4A is a plot of a transverse-magnetic (TM) photonic band structure of a triangular array of dielectric rods ($\epsilon_{rod}$=12.5) in a high-contrast background material ($\epsilon_{bg}$=1).
Figure 4B:
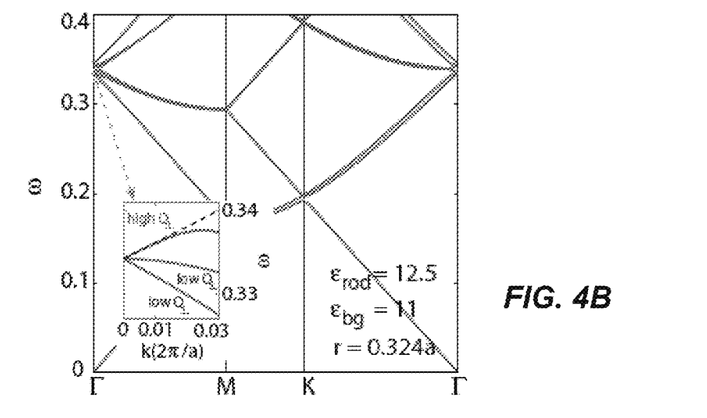
FIG. 4B is a plot of a TM photonic band structure of a triangular array of dielectric rods ($\epsilon_{rod}$=12.5) in a low-contrast background material ($\epsilon_{bg}$=11).

FIGS. 4A and 4B are plots of the transverse-magnetic (TM) photonic band structures calculated for a triangular array of dielectric rods ($\epsilon_{rod}=12.5$) in a high-contrast background material ($\epsilon_{bg}=1$) and a low-contrast background material ($\epsilon_{bg}=11$), respectively. These calculations were performed with a unit-cell using the MIT Photonic-Bands package. The band structures illustrated in FIGS. 4A and 4B were obtained by choosing a hexagonal lattice shape and an index contrast (high or low), then tuning the radius r of the dielectric rods in the lattice in terms of the lattice constant a to yield accidental Dirac cones. The insets at left in FIGS. 4A and 4B are close-ups of the band profile at the Γ point. These insets show that both the high- and low-contrast photonic crystals have accidental Dirac points at which three bands intersect.

The insets at right in FIG. 4A illustrate the modal profiles of the three accidentally degenerate modes at Γ with the electric field pointing into the page. All three modes have alternating positive and negative values, including the singly degenerate mode (upper curve). This singly degenerate mode's symmetry is mismatched with the free-space modes, so it has lower out-of-plane radiation losses than the other two modes, which have symmetries matched to the free-space modes. Thus, the band-edge modes of this singly degenerate band are the only lasing candidates within the spectral range shown in the insets of FIGS. 4A and 4B.

Figure 4C:
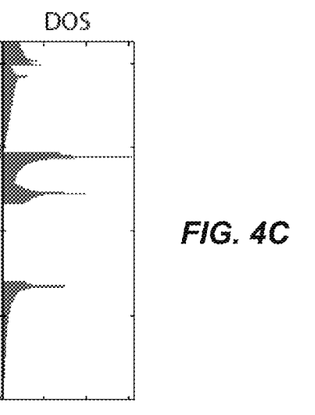
FIG. 4C is a plot of the density of states (DOS) of the triangular array of dielectric rods ($\epsilon_{rod}$=12.5) in a high-contrast background material ($\epsilon_{bg}$=1).

FIG. 4C is a plot of the density of states (DOS) of the high dielectric contrast photonic crystal. It shows that the DOS increases with normalized frequency until the Γ point, where it drops to zero before increasing linearly. More specifically, the resulting linear dispersion of the singly-degenerate mode (upper curve) has a density of states that vanishes linearly with decreasing frequency at the accidental Dirac point. This corresponds to large mode spacings near the band-edge at Γ and a high spontaneous emission coupling factor. (The DOS also vanishes over a band gap run from $\omega \approx 0.29$ to $\omega \approx 0.50$.)

Comparison of Photonic Crystals with Linear and Quadratic Dispersion

Figures 5A, 5B:
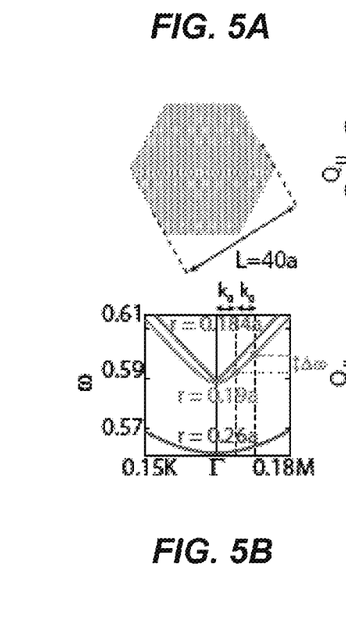

FIGS. 5A-5F provide a comparison of the band-edge modes of two finite-sized photonic crystals, one with an accidental Dirac point and the other with quadratic dispersion at Γ. Each of these photonic crystals comprises a triangular array of dielectric rods ($\epsilon_{rod}=12.5$) in air with dimension L, which may range from about 10a to about 10,000a (e.g., about 250a to about 10,000a; about 500a to about 1000a; etc.), as shown in FIG. 5A. In this case, the photonic crystal is hexagonal, and the dimension L is the diameter of the largest circle inscribed on the hexagon (i.e., L is twice the inradius of the hexagon). Other shapes are also possible, including circular, triangular, rectangular, and square photonic crystals.

Varying the radius r of the rods in the photonic crystal changes the band dispersions, as shown in FIG. 5B, which is a plot of the dispersion relations for r=0.184a, 0.19a, and 0.26a, where a is the lattice period. FIG. 5B shows that a linear dispersion is formed when r=0.184a while quadratic dispersions are formed at the other radii. FIG. 5B also shows that changing the rod radius shifts the frequency of the minimum dispersion.

Figure 5C:
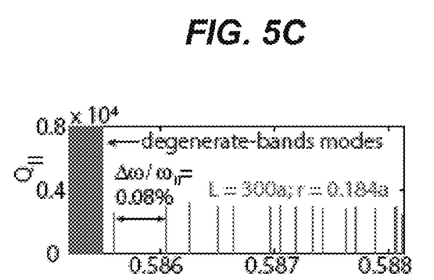
FIG. 5C is a plot of band-edge modes of a finite-sized photonic crystal cavity of L=300a with linear dispersion.
Figure 5D:
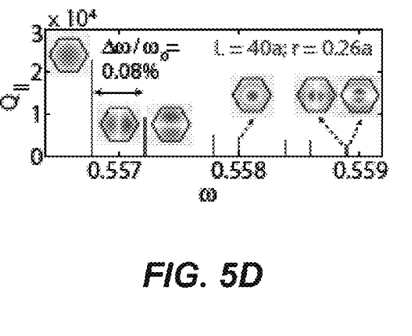
FIG. 5D is a plot of band-edge modes of a finite-sized photonic crystal cavity of L=40a with quadratic dispersion, with insets that show the mode profiles with the electric field pointing into the page.

FIGS. 5C and 5D are plots of the quality factors of the band-edge modes as a function of the frequency for a cavity of L=300a and r=0.184a with linear dispersion (FIG. 5C) and a cavity of L=40a and r=0.26a with quadratic dispersion (FIG. 5D). These results were calculated using finite-difference time-domain (FDTD) techniques with perfectly matched layer boundary regions. FIGS. 5C and 5D show that the first photonic crystal cavity at the accidental degeneracy has the same relative mode spacing between the first two band-edge modes as the second photonic crystal cavity even though the former is 50 times larger in area than the latter. FIGS. 5C and 5D (and in FIGS. 5E and 5F) show is that a photonic crystal cavity with an accidental Dirac point has a much larger mode spacing than a photonic crystal cavity of the same size without an accidental Dirac point.

FIGS. 5C and 5D also show that the in-plane quality factor of the first band-edge mode in the first cavity (linear dispersion) is an order of magnitude smaller than that of the first band-edge mode in the second cavity (quadratic dispersion). This low quality factor implies weak in-plane feedback and low localization effects. Moreover, the modes in the first cavity have similar quality factors, whereas the modes in the second cavity have quality factors whose values decrease with frequency. These trends in the quality factor confirm that the cavity has a linear band dispersion; as understood by those of skill in the art, the quality factors are inversely proportional to the band's slope. Since a linear band has a constant slope, the quality factors of the corresponding mode are the same. In contrast, a cavity with a quadratic band has a varying quality factor.

Figure 5E:
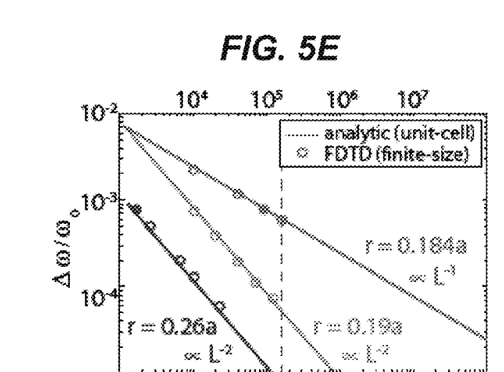
FIG. 5E is a plot of analytical determinations (lines) and finite-difference time-domain (FDTD) calculations (circles) of the first band-edge mode spacing as a function of the cavity area for the photonic crystal cavities associated with the band dispersions plotted in FIG. 5B.

Nonetheless, in both cases, the first band-edge mode with the highest quality factor lases with the lowest threshold. This is because the increase in quality factor with cavity size is not the main loss mechanism in large cavities. As can be seen in FIG. 5E, the losses reduces (the quality factor increases) with the cavity size. So long the cavity is made larger, the in-plane radiation losses represented by the in-plane quality factor $Q_\parallel$ can be made very small. Then, the dominant losses in large cavities will be the radiation loss in the out-of-plane direction, $Q_\perp$ as shown in the insets of FIGS. 4A and 4B.

FIG. 5E is a plot of the mode spacing as a function of the photonic crystal area for linear and quadratic dispersions at the band-edge for three different rod radii (r=0.184a, 0.19a, and 0.26a). The mode spacing of a finite-sized photonic crystal can be estimated from the dispersion relation using the periodic boundary condition to relate the dimension L to the in-plane wave vector k. The period of the periodic boundary condition is approximated to be 2L and L for the first and second band-edge mode based on the mode profiles shown in FIG. 5D; the monopole-like mode has half a period within L while the dipole-like mode has one period inside L. The corresponding wave vectors for these two modes are $k_0=\pi/L$ and $2k_0=2\pi/L$ under this approximation. The band-edge mode spacing is the frequency difference between these two k-points as illustrated in FIG. 5B. Using this approach, the mode spacing ($\Delta\omega$) of a photonic crystal with linear dispersion is found to be inversely proportional to L ($\Delta\omega=\pi\beta L$)

while the mode spacing of a quadratic dispersion is inversely proportional to $L^2$ ($\Delta\omega = 3\pi^2\alpha/L^2$), where $\beta$ is the linear slope and $\alpha$ is the quadratic curvature of the dispersion(s) near the band-edge.

FIG. 5E shows values for both the semi-analytical expressions (lines) described above and FDTD calculations of actual finite-sized photonic crystal cavities (circles). The FDTD results indicate that by tuning to a linear dispersion at accidental degeneracy, the mode spacing can be made much larger than that in a PCSEL with quadratic dispersion. For instance, at L=400a, the mode spacing at the accidental point (right-most line) is at least about 60 times larger than that of the detuned photonic crystals (middle and left-most lines). This increase in mode spacing becomes arbitrarily large as the area increases. Equivalently, for the same mode spacing, a photonic crystal with a linear dispersion can be made much larger in area than one with a quadratic dispersion. In FIG. 5E, the cavity size is increased by more than two orders of magnitudes when r is tuned from 0.26a to 0.184a while maintaining the same mode spacing ($\Delta\omega/\omega_0 = 1 \times 10^{-4}$).

Figure 5F:
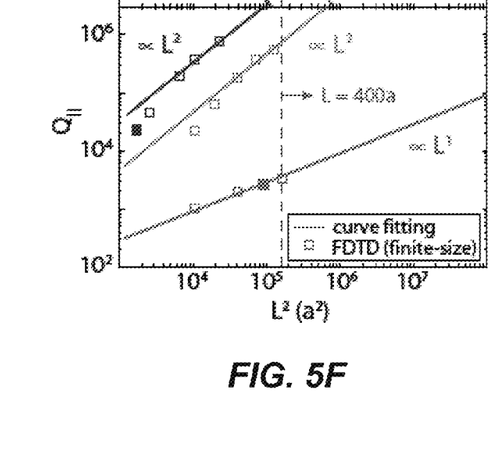
FIG. 5F is a plot of curve-fit determinations (lines) and FDTD calculations (circles) of the in-plane quality factor of the band-edge mode as a function of the cavity area for the photonic crystals cavities associated with the band dispersions plotted in FIG. 5B.

FIG. 5F is a plot of the in-plane quality factor as a function of the photonic crystal cavity area for linear and quadratic dispersions at the band-edge. The in-plane feedback strength is represented by the in-plane quality factor $Q_\parallel = \omega_0 \tau_\parallel$, where $\tau_\parallel$ (~$L/v_g$) is the photon lifetime in the photonic crystal cavity and $v_g = d\omega/dk$ is the group velocity. The group velocity is constant when the dispersion is linear and proportional to k when the dispersion is quadratic. Applying the periodic boundary condition shows that k scales as 1/L (the reciprocal of the cavity size). Hence, the in-plane quality factor scales with L when the dispersion is linear and $L^2$ when the dispersion is quadratic.

In FIG. 5F, the quality factors calculated from finite-sized cavities agree well with the above trends, except for small structures whose modes are of k values too far away from $\Gamma$ to follow the quadratic functions. Physically, the linear increase of the in-plane quality factor with L implies that the distributed in-plane feedback in a typical PCSEL is completely eliminated at the accidental degeneracy. In other words, the PCSEL behaves like a two-dimensional Fabry-Perot cavity where feedback only comes from its end mirrors. However, unlike typical Fabry-Perot cavities where all the modes have the same quality factors, a PCSEL with an accidental Dirac point can still select the first band-edge mode to lase due to its highest quality factor value. In practice, fabrication imperfections may cause field localization effects, but those effects are much reduced when the band-edge exhibits linear dispersion (with weaker in-plane feedback strength).

One-Dimensional Periodic Slabs (Unit-Cell Calculations)

Linear dispersions at $\Gamma$ exist in one-dimensional photonic crystals at the quarter-wave-stack (QWS) condition where the two bands are accidentally degenerate. Similar features exist in one-dimensional photonic crystal slabs when the band-edges are tuned to be degenerate, except for a caveat: the two bands remain degenerate even away from $\Gamma$.

Figure 6A:
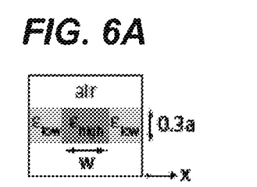
FIG. 6A shows a unit-cell of a 0.3a thick, one-dimensional photonic crystal slab that includes alternating high ($\epsilon_{high}$) and low dielectric constant ($\epsilon_{low}$) materials whose width is tuned so that the bands are accidentally degenerate at Γ.

FIG. 6A is a diagram of a unit cell of one-dimensional photonic crystal slab with degenerate band-edges. This unit cell has a length a and comprises slab of dielectric material whose vertical dimension (as illustrated) is about 0.3a surround by air. The slab includes horizontally alternating layers of high- and low-dielectric material; the high-index material layer has a width w. This width w is tuned so that the photonic crystal's bands are accidentally degenerate at $\Gamma$.

Figure 6B:
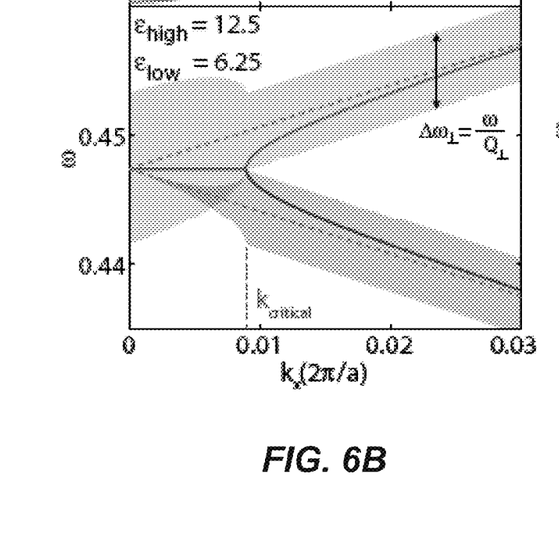
FIG. 6B is a plot of the band structure of the photonic crystal slab in FIG. 6A with $\epsilon_{high}$=12.5 and $\epsilon_{low}$=6.25.
Figure 6C:
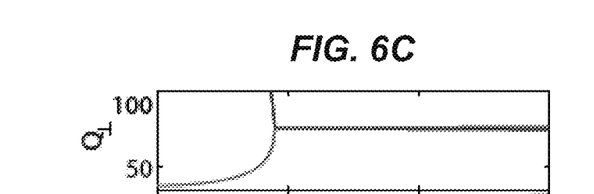
FIG. 6C is a plot of out-of-plane quality factor versus wave vector for the photonic crystal slab in FIG. 6A with $\epsilon_{high}$=12.5 and $\epsilon_{low}$=6.25.

FIG. 6B is a plot of the band diagram for the two lowest band-edge modes at $\Gamma$ of the photonic crystal shown in FIG. 6A with dielectric constant values of $\in_{high}=12.5$ and $\in_{low}=6.25$. (There are a pair of even lower band-edge modes at $k_x=0.5$.) FIG. 6C is a plot of the quality factor values corresponding to the band-edge modes shown in FIG. 6B. And FIG. 6D is a plot of the band diagram for the two lowest band-edge modes of the photonic crystal shown in FIG. 6A with dielectric constant values of $\in_{high}=12.5$ and $\in_{low}=11$.

Figure 6D:
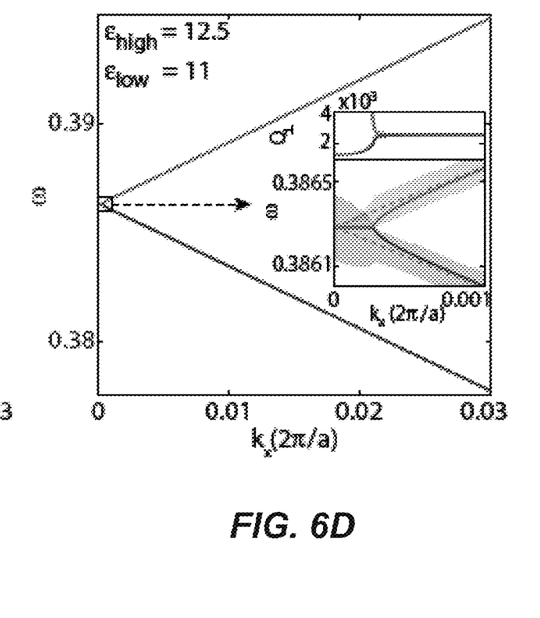
FIG. 6D is a plot of the band structure of the photonic crystal slab in FIG. 6A with $\epsilon_{high}$=12.5 and $\epsilon_{low}$=11.

The shaded regions in FIGS. 6B and 6D represent the radiation-loss linewidths of the two bands centered along the dashed lines. The dashed lines indicate the uncoupled linear dispersions expected in a one-dimensional photonic crystal (with no radiation loss) at the QWS condition. In slabs, however, the two bands are frequency-locked when their in-plane wave vectors $k_x$ are less than a critical wave vector, $k_{critical}$, indicated in FIG. 6B. (This critical wave vector $k_{critical}$, is the value $k_x$ when the second term in the right-hand side of Eq. (1) (below) is set to zero. It is directly proportional to the linewidth and inversely proportional to the group velocity.)

The flat band region occurs when the two modes' frequencies are close enough so that their respective radiation-loss linewidths ($\Delta\omega_\perp$) overlap with each other in frequency. Physically, the critical wave vector marks the point beyond which the two modes no longer interact via the out-of-plane radiation-loss channel. For the band-edge modes to have large mode spacings and low in-plane feedback, it is desirable to keep the critical wave vector small so the first band-edge mode can operate outside this flat-band region.

Coupled-wave theory can be used to model the frequency-locking behavior of the one-dimensional photonic crystal slab at $\Gamma$ using the coupled-wave theory, similar to the analysis for the second-order DFB lasers. Periodic index modulation in the photonic crystal slab couples the forward propagating waves ($k_x=2\pi/a$) to an out-of-plane radiating wave ($k_x=0$) in first-order diffraction, and to a backward propagating wave ($k_x=-2\pi/a$) in second-order diffraction. Higher diffraction orders carrying little energy are neglected. These three terms of the electric field are plugged into the Maxwell equations, and the dispersion relation at accidental degeneracy can be derived as $$\frac{\Delta\omega_g}{v'_g} = -i\frac{\Delta\omega'_\perp}{2v'_g} \pm \sqrt{k_x^2 - \left(\frac{\Delta\omega'_\perp}{2v'_g}\right)^2}. \quad (1)$$

Here, $\Delta\omega_g$ is the departure of the frequency from the accidental degenerate frequency, $\Delta\omega'_\perp = \omega/Q_\perp$ is the linewidth of out-of-plane radiation-loss when $k_x > k_{critical}$, and $v_g'$ is the slope of the linear dispersion (dashed line). The two dispersion curves merge when the real part of $\Delta\omega_g$ is zero, which is the case when $k_x < k_{critical} = \Delta\omega'_\perp/2v_g'$. The critical wave vector $k_{critical}$ is thus inversely proportional to both the out-of-plane quality factor and the slopes of the linear dispersions. On the other hand, the imaginary part of $\Delta\omega_g$ is related to the linewidth of out-of-plane radiation-loss.

At $k_x=0$, Eq. (1) predicts a mode with infinite out-of-plane quality factor and another with quality factor half of the out-of-plane quality factor value outside the critical wave vector. This trend is consistent with the quality factor plot in FIG. 6C. The analysis above remains valid in active systems with uniform gain or loss which simply adds an imaginary term to Eq. (1).

FIG. 6D shows the band diagram of the photonic crystal in FIG. 6A with the dielectric constant of the low dielectric material set to $\in_{low}=11$ (instead of $\in_{low}=6.25$). The inset of FIG. 6D shows the band diagram near the critical wave vector (lower plot) and the out-of-plane quality factor (upper plot) for k<0.001. This decrease in the contrast ratio makes it possible to verify the analytical model in Eq. (1) and to demonstrate how to control the size of the flat-band region. FIG. 6D shows that the same frequency-locking behavior exists in a low-contrast material, but that the critical wave vector value is 30 times smaller. This reduction in critical wave vector by more than an order of magnitude is due to the roughly 30 times increase in the perpendicular quality factors of both bands when the dielectric constant is made larger.

The frequency-locking phenomenon described above, where accidentally-touched band dispersions merge further through radiation losses, can also be found in a system of periodic gain-loss modulations. However, this analysis does not apply to symmetry-protected band degeneracies, such as the linear Dirac and the quadratic degeneracies at K in FIG. 4A. Those dispersion relations do not alter unless their underlining symmetries are broken. Although the symmetry-protected Dirac points are more robust than the single accidental one under the perturbation of loss, gain, refractive index or structural changes, they do not possess the benefits of single-mode operation nor vertical emission.

Finite One-Dimensional Periodic Slabs

Figure 7A:
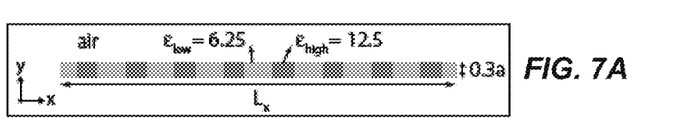
FIG. 7A illustrates a finite-sized, 0.3a thick, one-dimensional photonic crystal slab of dimension $L_x$ comprising alternating layers of high ($\epsilon_{high}$=12.5) and low ($\epsilon_{low}$=6.25) dielectric constant materials.

FIG. 7A illustrates a finite-length slab structure with a unit cell identical to the unit cell shown in FIG. 6A. In this finite slab structure, radiation loss occurs in both the in-plane and out-of-plane directions. The total quality factor $Q_{tot}$ is calculated using the finite-element method (FEM) and is related to the in-plane and out-of-plane radiation losses by power conservation: $1/Q_{tot}=1/Q_\parallel+1/Q_\perp$. To obtain the in-plane and out-of-plane quality factors from the total quality factor, the time-averaged power density are integrated along the boundaries of a box enclosing the photonic crystal slab, and the fraction of the total escaped power in the x- and y-directions is found.

Figure 7B:
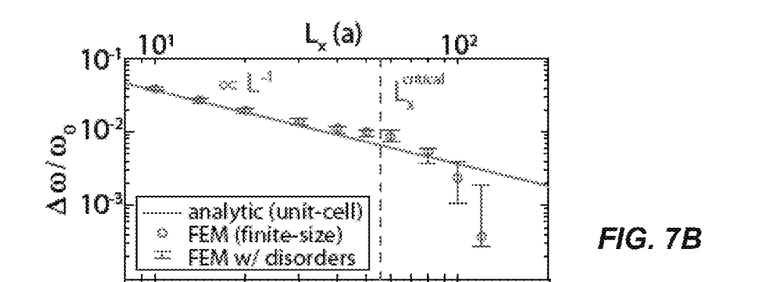
FIG. 7B is a plot of the mode spacing between the first and second band-edge modes of the photonic crystal shown in FIG. 7A as a function of the photonic crystal slab dimension $L_x$.
Figure 7C:
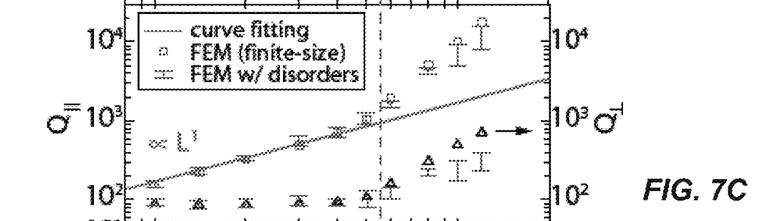
FIG. 7C is a plot of in-plane quality factor (left axis) and out-of-plane quality factor (right axis) of the first band-edge mode of the photonic crystal shown in FIG. 7A as a function of the photonic crystal slab dimension $L_x$.
Figure 7D:
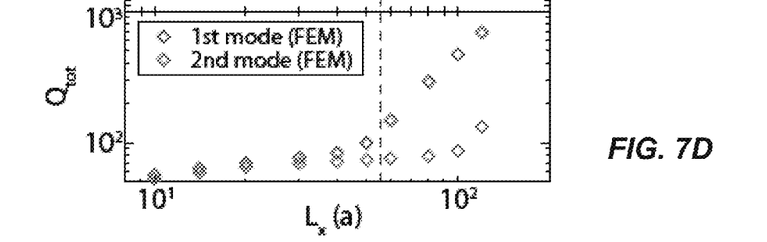
FIG. 7D is a plot of the total quality factor of the first and second band-edge modes of the photonic crystal shown in FIG. 7A as a function of the photonic crystal slab dimension $L_x$.

FIGS. 7B, 7C, and 7D are plots of the mode spacings, in-plane and out-of-plane quality factors, and total quality factors versus photonic crystal size for the finite-length slab structure shown in FIG. 7A. FIG. 7B shows analytic results (line) and results for FEM calculations with (error bars) and without (circles) disorders. FIG. 7C shows curve-fitting results (line) and results for FEM calculations with (error bars) and without (triangles and squares) disorders. FIG. 7D shows FEM results for the slab's first and second band-edge modes.

In the periodic boundary condition analysis above, $k_x=\pi/L_x$ is related to the first band-edge mode. Using this relationship makes it possible to relate the critical wave vector value in FIG. 6B to the corresponding critical dimension $L_x^{critical}$ indicated in FIG. 7. This critical dimension separates the three plots into two regions. When the photonic crystal dimension is less than the critical dimension $L_x^{critical}$, the first band-edge mode lies outside the flat band region in FIG. 6B where the dispersion is linear. This is confirmed in FIGS. 7B and 7C, which show that the mode spacing of the first band-edge mode scales with $L_x^{-1}$ while its out-of-plane quality factor value scales with $L_x$. The total quality factor values of the first and second band-edge modes are similar, however, making single-mode selection difficult. When the photonic crystal dimension is greater that the critical dimension, the total quality factor values between the first and second band-edge modes are prominent, facilitating single-mode selection. In this case, however, the first band-edge mode lies in the flat band region of FIG. 6B where its mode spacing decreases sharply and its in-plane quality factor value increases at a rate faster than $L_x^2$ as the cavity size increases. Consequently, choosing a cavity size close to the critical dimension avoids these disadvantages and enables single-mode emission over a large-area for a PCSEL.

FIGS. 7B and 7C also show how structural disorders might affect the band-edge mode spacing and in-plane feedback at the accidental degeneracy. More specifically, these plots show the effect on FEM calculations of randomly perturbing both the locations and widths of the high-indexed blocks in the finite-sized photonic crystal slabs. Ten different disordered cavities were calculated for each crystal dimension, where the disorders were generated with Gaussian distributions of standard deviation 0.02a. The error bars in FIGS. 7B and 7C represent the statistical results. These error bars are centered at the mean values and the bars' heights are twice the standard deviations. FIGS. 7B and 7C show that, below the critical dimension, both the mode spacings and the in-plane quality factors retain their linear relationship with photonic crystal size despite these perturbations.

Two-Dimensional Periodic Slabs (Unit-Cell Calculations)

Figure 8A:
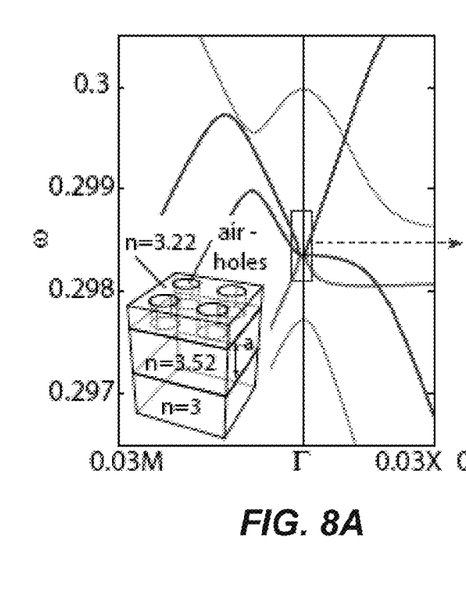
FIG. 8A is a plot of the band structure (transverse electric (TE)-like modes near Γ) of a GaAs-based, two-dimensional photonic crystal slab on an AlAs (n=3) substrate.

FIG. 8A is a plot of the band structure in a two-dimensional photonic crystal GaAs-based slab on an AlAs substrate. The inset of FIG. 8A shows a 2×2 unit-cell group of the photonic crystal, which includes a 0.467a-thick GaInP (n=3.22) layer patterned with a square array of air-holes with radius 0.285a (a is the lattice period). A homogeneous 1a-thick GaAs (n=3.516) layer is sandwiched between the GaInP layer and the AlAs substrate. The hole radius is tuned so that the pair of doubly-degenerate modes (the upper bands) is accidentally degenerate with a singly-degenerate mode (lower band) at Γ. This accidental degeneracy is achieved by tuning the air-hole radius.

Figure 8B:
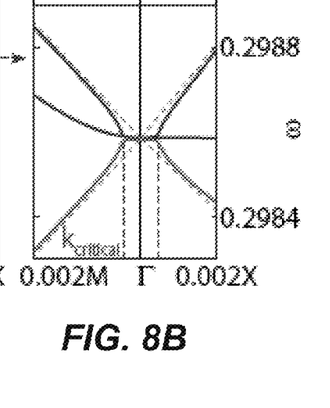
FIG. 8B is a close-up of the plot shown in FIG. 8A.
Figure 8C:
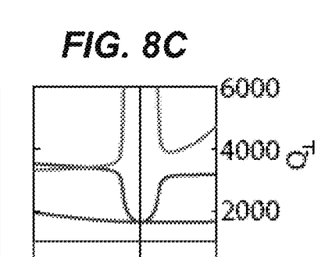
FIG. 8C is a plot of out-of-plane quality factor versus wave vector for the photonic crystal slab whose band structure is plotted in FIG. 8B.

FIGS. 8B and 8C are close-ups of the band structure and the out-of-plane quality factor, respectively, near Γ. They show that this photonic crystal exhibits frequency-locking behaviors similar to those noted above: a critical wave vector exists so that the bands form a two-dimensional, flat plane for wave vectors whose magnitudes are less than that of the critical wave vector and becomes linear as the wave vector magnitude increases. Single-mode PCSEL operation is again possible because the out-of-plane quality factor diverges only for one band (the lower band in FIG. 8B). As before, the critical wave vector is related to the mode coupling via the radiation-loss channel in air and can be tuned to be large or small. Here, without any optimizations, the critical photonic crystal dimension is roughly 2500a. This corresponds to a cavity area more than six times larger than some of the largest PCSEL areas reported to date.

The flat-band regions of the band diagrams (near Γ) can potentially have high densities of states. This is confirmed in FIG. 7 where the mode spacing reduces abruptly and the total quality factor increases as the length of the photonic crystal slab grows beyond the critical photonic crystal dimension. Moreover, three-fold band degeneracies in two-dimensional photonic crystal slabs may further enhance the density of states. While the PCSELs disclosed herein have relatively tiny flat-band regions to promote single-mode operation over larger areas, a large k-region of flat bands providing a large density of states can be useful for enhancing light-emitters and light-matter interactions.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A surface-emitting laser comprising:
a gain medium to emit an electromagnetic wave; and
a photonic crystal, electromagnetically coupled to the gain medium and having an energy band structure characterized by a Dirac point at or near a center of a Brillouin zone of the photonic crystal and at a frequency within a gain band of the gain medium, to support radiation of at least a portion of the energy in the electromagnetic wave in a direction substantially orthogonal to a plane of the photonic crystal.

2. The surface-emitting laser of claim 1, wherein the gain medium comprises at least one of a quantum well, a quantum dot, a quantum wire, and an organic molecule.

3. The surface-emitting laser of claim 1, wherein the gain medium comprises at least one of GaAs, AlGaAs, InGaAs, InGaAsP, GaN, Si, Ge, GaP, InAlGaN, InAs, InSb and SiN.

4. The surface-emitting laser of claim 1, wherein the photonic crystal supports propagation of a single mode of the electromagnetic wave in the plane of the photonic crystal.

5. The surface-emitting laser of claim 4, wherein the single mode is a first mode from the center of the Brillouin zone of the photonic crystal.

6. The surface-emitting laser of claim 5, wherein:
the photonic crystal defines a two-dimensional surface with an area $L^2$, through which the at least the portion of the energy radiates out of the photonic crystal; and
a spacing between the first mode and a second mode from the center of the Brillouin zone varies in proportion to $L^{-1}$.

7. The surface-emitting laser of claim 1, wherein the Dirac point comprises an intersection of respective linear regions of at least two energy bands in the energy band structure of the photonic crystal.

8. The surface-emitting laser of claim 1, wherein the Dirac point represents an intersection of respective linear regions of at least three energy bands in the energy band structure of the photonic crystal.

9. The surface-emitting laser of claim 1, wherein the photonic crystal defines a plurality of holes having a radius r, a period a, and a first index $n_1$ in a dielectric material having a second index $n_2$, and
wherein the ratio r/a is about 0 to about 0.5 and the ratio $n_1/n_2$ is about 0.25 to about 1.0.

10. The surface-emitting laser of claim 1, wherein the photonic crystal comprises a plurality of rods having a radius r, a period a, and a first index $n_1$ in a dielectric material having a second index $n_2$, and
wherein the ratio r/a is about 0 to about 0.5 and the ratio $n_1/n_2$ is about 1.0 to about 4.0.

11. The surface-emitting laser of claim 1, wherein the photonic crystal comprises at least one of a plurality of holes and a plurality of rods arrayed in at least one of an oblique lattice, a rectangular lattice, a rhombic lattice, a hexagonal lattice, and a square lattice.

12. The surface-emitting laser of claim 1, wherein the photonic crystal has a period a and an output surface of the surface-emitting laser has at least one dimension of about 10a to about 10,000a.

13. The surface-emitting laser of claim 12, wherein the period a is about 150 nm to about 550 nm.

14. The surface-emitting laser of claim 1, wherein the electromagnetic wave has a wavelength λ and the photonic crystal has a thickness of about λ/10 to about 10λ.

15. The surface-emitting laser of claim 1, wherein the photonic crystal comprises at least one of GaAs, AlGaAs, InGaAs, InGaAsP, GaN, Si, Ge, GaP, InAlGaN, InAs, InSb, and SiN.

16. The surface-emitting laser of claim 1, further comprising:
at least one electrode, in electrical communication with the gain medium, to stimulate emission of the electromagnetic wave from the gain medium.

17. The surface-emitting laser of claim 1, further comprising:
a pump source, in optical communication with the gain medium, to optically pump the gain medium so as to stimulate emission of the electromagnetic wave from the gain medium.

18. A method of making a surface-emitting laser, the method comprising:
fabricating a photonic crystal having an energy band structure characterized by a Dirac point at a center of a Brillouin zone of the photonic crystal; and disposing a gain medium in electromagnetic communication with the photonic crystal having an energy band structure characterized by a Dirac point at or near the center of a Brillouin zone of the photonic crystal and at a frequency within a gain band of the gain medium so as to support:

(i) propagation of a single mode of the electromagnetic wave in a plane of the photonic crystal, and (ii) radiation of at least a portion of the energy in the electromagnetic wave in a direction substantially orthogonal to a plane of the photonic crystal.

19. The method of claim 18, wherein the single mode is a first mode from the center of the Brillouin zone.

20. The method of claim 18, wherein fabricating the photonic crystal comprises defining the photonic crystal to define:

a two-dimensional surface with an area $L^2$, through which the at least a portion of the energy radiates out of the photonic crystal; and a spacing between modes of the photonic crystal that varies in proportion to $L^{-1}$.

21. The method of claim 18, wherein fabricating the photonic crystal comprises:

selecting at least one of hole radius, rod radius, hole pitch, rod pitch, lattice shape, thickness, refractive index, and period of the photonic crystal so as to form a degeneracy at the Dirac point of at least three energy bands of the photonic crystal.

22. The method of claim 18, wherein fabricating the photonic crystal comprises:

forming a plurality of holes having a radius r, a period a, and a first index $n_1$ in a dielectric material having a second index $n_2$, wherein the ratio r/a is about 0 to about 0.5 and the ratio $n_1/n_2$ is about 0.25 to about 1.0.

23. The method of claim 18, wherein fabricating the photonic crystal comprises:

forming a plurality of rods having a radius r, a period a, and a first index $n_1$ in a dielectric material having a second index $n_2$, wherein the ratio r/a is about 0 to about 0.5 and the ratio $n_1/n_2$ is about 1.0 to about 4.0.

24. The method of claim 18, wherein fabricating the photonic crystal comprises:

forming at least one of a plurality of holes and a plurality of rods in at least one of an oblique lattice, a rectangular lattice, a rhombic lattice, a hexagonal lattice, and a square lattice.

25. The method of claim 18, wherein fabricating the photonic crystal comprises selecting a period a of the photonic crystal, and further comprising:

setting at least one dimension of an output surface of the surface-emitting laser to be about 10a to about 10,000a.

26. The method of claim 25, wherein the period a is about 150 nm to about 550 nm.

27. The method of claim 18, wherein the electromagnetic wave has a wavelength λ and fabricating the photonic crystal comprises selecting a thickness of the photonic crystal to be about λ/10 to about 10λ.

28. The method of claim 18, wherein fabricating the photonic crystal comprises:

etching at least one of GaAs, AlGaAs, InGaAs, InGaAsP, GaN, Si, Ge, GaP, InAlGaN, InAs, InSb and SiN.

29. The method of claim 18, wherein disposing the gain medium in electromagnetic communication with the photonic crystal comprises:

forming at least one quantum well electromagnetically coupled to the photonic crystal.

30. The method of claim 18, further comprising:

forming the gain medium from at least one of GaAs, AlGaAs, InGaAs, InGaAsP, GaN, Si, and SiN.

31. The method of claim 18, further comprising:

forming the gain medium from an organic dye medium.

32. The method of claim 18, wherein fabricating the photonic crystal comprises selecting a period a of the photonic crystal, and further comprising further comprising:

disposing at least one electrode in electrical communication with the gain medium; and placing the at least one electrode in electrical communication with a power source.

33. A method of generating an electromagnetic wave having a single mode, the method comprising:

stimulating emission of the electromagnetic wave by a gain medium; and coupling the electromagnetic wave into a photonic crystal having an energy band structure characterized by a Dirac point at or near a center of a Brillouin zone of the photonic crystal and at a frequency within a gain band of the gain medium so as to support:

(i) propagation of a single mode of the electromagnetic wave in a plane of the photonic crystal, and (ii) radiation of at least a portion of the energy in the electromagnetic wave in a direction substantially orthogonal to a plane of the photonic crystal.

34. The method of claim 33, wherein stimulating emission of the electromagnetic wave comprises applying at least one of electrically pumping the gain medium and optically pumping the gain medium.

35. The method of claim 33, further comprising:

emitting the single mode of the electromagnetic wave via a surface of a surface-emitting laser that comprises the gain medium and the photonic crystal.

* * * * *